US008085967B2

(12) United States Patent
Sumitani et al.

(10) Patent No.: US 8,085,967 B2
(45) Date of Patent: Dec. 27, 2011

(54) REVERSIBLE SPEAKER GRILL ATTACHMENT

(75) Inventors: Yoichiro Sumitani, Rancho Palos Verdes, CA (US); Lin Chun-Yi, Xinzhuang (TW)

(73) Assignee: Sound Sources Technology, Inc.

( * ) Notice: Subject to any disclaimer, the term of this patent is extended or adjusted under 35 U.S.C. 154(b) by 1012 days.

(21) Appl. No.: 11/442,552

(22) Filed: May 26, 2006

(65) Prior Publication Data

US 2007/0274554 A1 Nov. 29, 2007

(51) Int. Cl.
*H04R 1/02* (2006.01)
*H04R 27/00* (2006.01)
*H05K 5/00* (2006.01)
*A47B 81/06* (2006.01)

(52) U.S. Cl. ........... 381/389; 381/86; 181/150; 181/198

(58) Field of Classification Search .................. 381/391, 381/395, 386, 388, 389, 86, 87; 181/150, 181/199, 141, 198
See application file for complete search history.

(56) References Cited

U.S. PATENT DOCUMENTS

| | | | | |
|---|---|---|---|---|
| 3,952,834 | A | 4/1976 | Soma et al. | |
| 4,326,599 | A | 4/1982 | Thompson et al. | |
| 4,331,841 | A * | 5/1982 | Castagna | 381/186 |
| 4,503,292 | A | 3/1985 | Johnson et al. | |
| 4,546,850 | A | 10/1985 | Litner | |
| 4,974,698 | A | 12/1990 | Smith | |
| 4,993,511 | A * | 2/1991 | Hiraki et al. | 181/150 |
| 5,619,585 | A | 4/1997 | Grasso | |
| 6,273,656 | B1 * | 8/2001 | Cleland et al. | 411/45 |
| 6,305,892 | B1 * | 10/2001 | Qiao | 411/508 |
| 6,505,705 | B1 * | 1/2003 | Espiritu et al. | 181/150 |
| 6,661,902 | B1 | 12/2003 | Ziegler et al. | |

OTHER PUBLICATIONS

Thorson, Casey. Car Audio Magazine. Rockford Fosgate p212S4 Car Audio Subwoofer. 2006. http:// www.caraudiomag.com/testreports/0604ca2_rockford_fosgate_p1212s4_subwoofer/index.html.

* cited by examiner

*Primary Examiner* — Curtis Kuntz
*Assistant Examiner* — Sunita Joshi
(74) *Attorney, Agent, or Firm* — Stetina Brunda Garred & Brucker

(57) ABSTRACT

A loudspeaker having a speaker basket including a basket rim, a speaker mounting hole, and a coupling hole disposed through the basket rim. The loudspeaker includes a first grill coupling engaged with the coupling hole, as well as a grill removably attached to the basket rim via the first grill coupling. The grill defines a solid surface portion which completely covers the speaker mounting hole and the coupling hole. The first grill coupling is interposed between the basket rim and the grill.

16 Claims, 11 Drawing Sheets

REVERSIBLE SPEAKER GRILL ATTACHMENT

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Technical Field

The present invention generally relates to loudspeakers. More particularly, the present invention relates to loudspeakers having a reversible grill attachment configured to cover a coupling hole and a speaker mounting hole on a speaker basket rim.

2. Related Art

Conventional loudspeakers are generally defined by a front face and a back section. Features of a loudspeaker typically visible on the front face include such components as a cone, a dust cap, and a surround which suspends the cone. The surround is typically fixed to a rim of a basket, which may also be visible on the front face. Features visible from the back section include such components as a magnet, the back side of the cone, a spider, terminals for connecting the speaker to an electrical signal source, and the wall and base portions of the basket.

Loudspeakers are typically mounted to other structures such as enclosures, walls, automotive wall structures, and the like. The surfaces of such structures are generally referred to in the art as baffles, and the loudspeakers are mounted thereto for stability, for directing the generated sound waves, and for improved acoustical characteristics. The sound waves generated by the loudspeaker in the direction of the front face is out of phase with the sound waves generated in the reverse direction of the front face, leading to the cancellation of the in-phase sound wave. It has been recognized that the baffle prevents such interference produced by the out-of-phase sound wave.

The shape and configuration of baffles may be considerably varied depending on the application, but are typically planar and define a front side and a back side. The baffle typically defines a hole having a sufficient diameter such that the back section of the loudspeaker fits through the hole and is positioned on the back side of the baffle. Further, the diameter of the hole will be less than that of the front face of the loudspeaker, thereby preventing the entirety of the loudspeaker to slide through the hole. In conventional configurations, the loudspeaker is mounted to the baffle in the aforementioned manner, where the front face of the loudspeaker is positioned on the front side of the baffle, and the back side of the loudspeaker is positioned on the back side of the baffle, with the loudspeaker being inserted through the hole.

Subwoofers, which are loudspeakers optimized for the generation of sound in the lowest range of the audio spectrum, are frequently utilized in car audio systems for improved bass characteristics. Subwoofers are typically mounted in the aforementioned manner, with the front face is positioned on the front side of the baffle. In most consumer settings the subwoofer is placed in the trunk and away from view, but in certain enthusiast circles, it is desirable to display and showcase the subwoofer, along with other speakers making up the car audio system. In this regard, elaborate, thematically consistent decorative elements have been utilized, often being incorporated into the design of the speakers. One such element is the grill. It is recognized that the term “grill” may also refer to a meshed structure substantially covering the entire front face; however, as used herein, a grill refers to the structure covering the basket rim. Another term which may reference this structure may be, for example, “mounting ring.”

In some situations, as will be appreciated by those in the aforementioned enthusiast circles, it has been desirable to mount the subwoofer in a reverse direction, in which the front face is positioned to face the front side of the baffle, with the back section projecting therefrom. To accommodate both mounting techniques, a grill which could be attached to either the front face or the back section of the loudspeaker was developed.

Conventional grills, and the basket capable of accommodating them, whether reversible or not, were deficient. Specifically, the grill was attached to the speaker using the same screw used to mount the speaker to the baffle. While this configuration improved the connection between the grill and the speaker, the designs capable of being incorporated into the grill were significantly limited. Therefore, there is a need in the art for an alternative loudspeaker configuration overcoming the aforementioned deficiencies.

BRIEF SUMMARY OF THE INVENTION

According to an embodiment of the present invention, there is provided a loudspeaker including a speaker basket. The speaker basket may include a basket rim, a speaker mounting hole, and a coupling hole disposed through the basket rim. Additionally, there may be a first grill coupling engaged with the coupling hole. Further in accordance with the present invention, there is provided a grill which may be removably attached to the basket rim via the first grill coupling. The grill may also define a solid surface portion which completely covers the speaker mounting hole and the coupling hole. The first grill coupling may be interposed between the basket rim and the grill. There may also be a second grill coupling which is engaged to the first grill coupling. The present invention will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The detailed description set forth below in connection with the appended drawings is intended as a description of the presently preferred embodiment of the invention, and is not intended to represent the only form in which the present invention may be constructed or utilized. It is to be understood that the use of relational terms such as first and second, top and bottom, proximal and distal, and the like are used solely to distinguish one entity from another entity without necessarily requiring or implying any actual such relationship or order between such entities.

Figure 1:
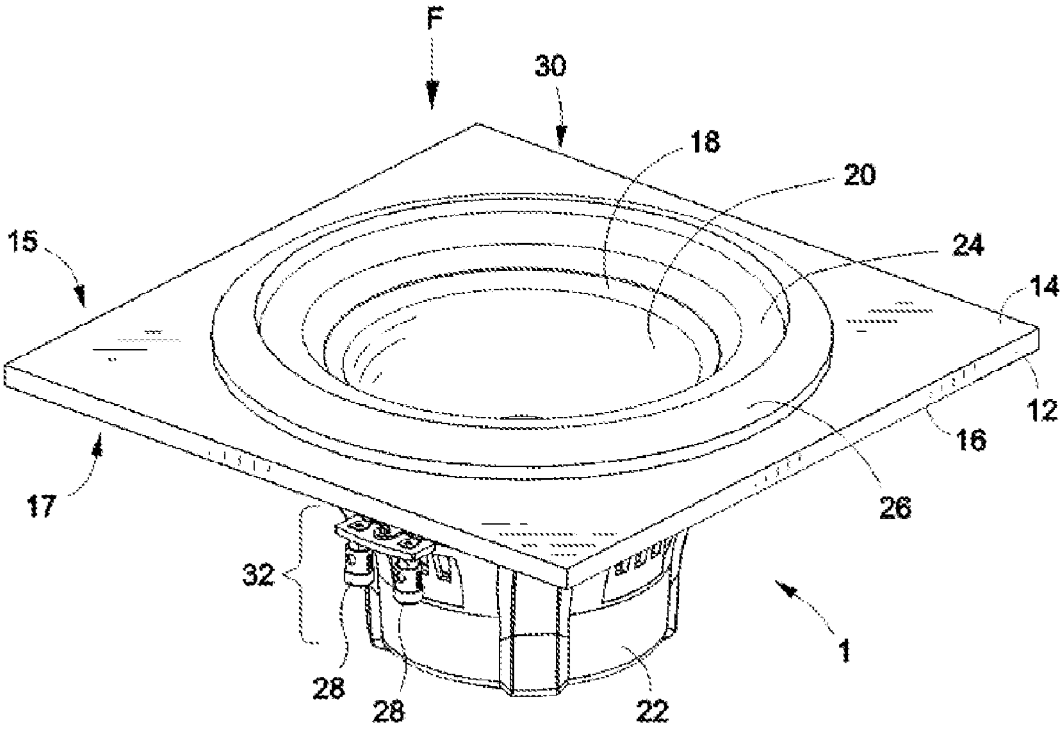
FIG. 1 is a perspective view of a loudspeaker according to the present invention, the loudspeaker being in a forward mounting configuration.
Figure 2:
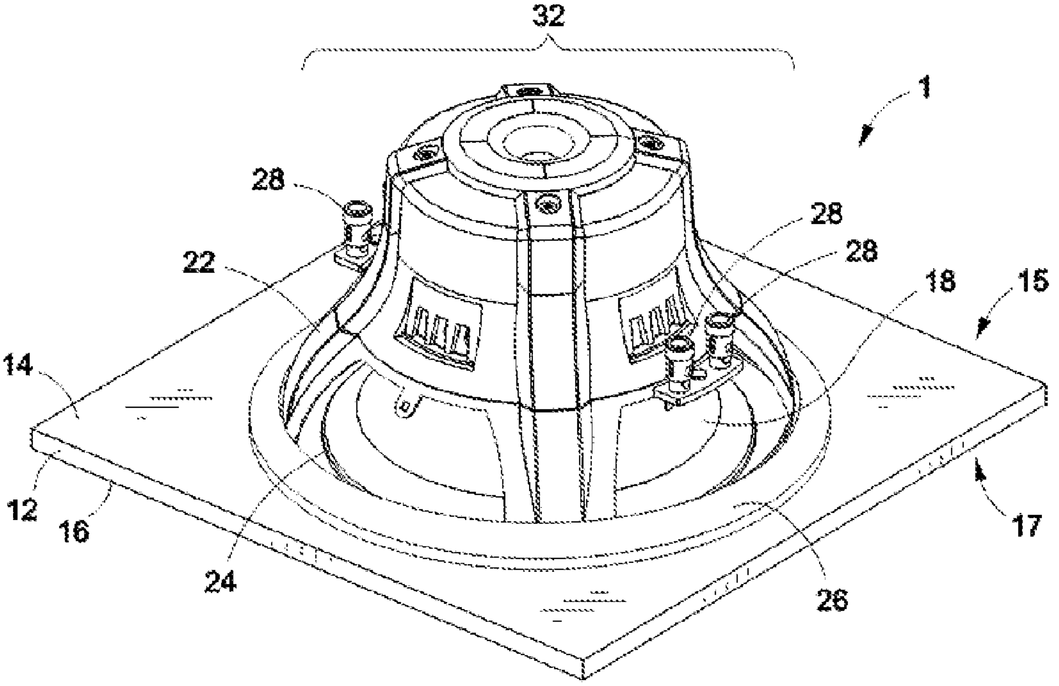
FIG. 2 is a perspective view of the loudspeaker in a reverse mounting configuration.

With reference to FIGS. 1 and 2, a loudspeaker 1 in accordance with the present invention is shown mounted to a baffle 12. The baffle 12 defines a baffle top surface 14 and an opposed baffle bottom surface 16. The region adjoining the baffle top surface 14 will be referred to as the top region 15 and the region adjoining the baffle bottom surface 16 will be referred to as the bottom region 17. The loudspeaker 1 includes a cone 18 and a dust cap 20. With additional reference to FIG. 3, the cone 18 is supported within a basket 22 by a surround 24, which is also attached to a basket rim 23. Referring to FIGS. 1 and 2, attached to the basket rim 23 is an annular grill 26. As discussed above in relation to the background, it is recognized that the term “grill” may refer to a mesh component substantially covering the loudspeaker 1. However, as utilized herein, it is to be understood that the term “grill” will also refer to the annular structure illustrated in FIGS. 1 and 2, among others, and referenced as grill 26. One of ordinary skill in the art will recognize that the grill need not be limited to the annular shape as described herein, and any number of different configurations such as oval shapes, rectangular shapes, and the like may be readily substituted without departing from the scope of the present invention. Additionally, there is included a plurality of terminals 28 for connecting to an electrical signal source.

Figure 4:
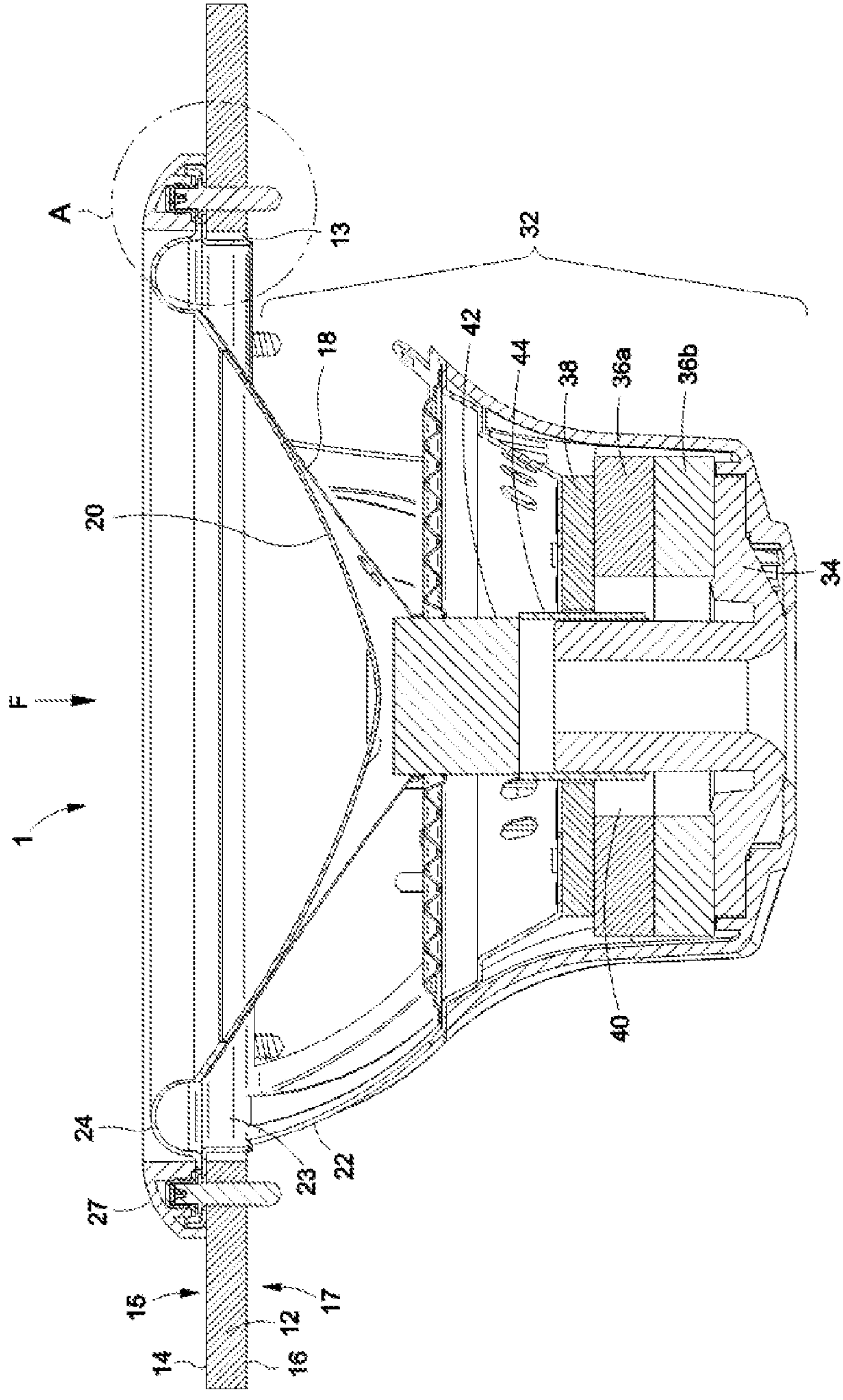
FIG. 4 is a cross-sectional view of the loudspeaker according to the first embodiment in a forward mounting configuration.

Generally, the loudspeaker 1 may be defined by a front face 30 and a back section 32. When viewed from angle F, visible on the front face 30 is the cone 18, the dust cap 20, the surround 24, and the grill 26. Referring to FIG. 4, the back section 32 includes the basket 22 supporting a yoke 34, a pair of annular magnets **36*a*, 36*b*, and a top plate 38. As will be readily recognized, the top plate 38, the magnets 36*a*, 36*b*, and the yoke 34 define an air gap 40. Within the air gap 40 is disposed a cylindrical bobbin 42 including a voice coil 44. An electrical signal transmitted through the voice coil 44 via the terminal 28 is operative to generate a magnetic force in conjunction with the magnets 36*a*, 36*b*, vibrating the bobbin 42 and thus the cone 18, effectively generating sound waves. The bobbin 42 is fixed to the cone 18, and covered with the dust cap 20. The surround 24 supports the cone 18 and attaches to the rim 23 of the basket 22. It will be understood by one of ordinary skill in the art that the details pertaining to the back section 32 hereinbefore described is presented by way of example only and not of limitation. Such a person will also understand that numerous variations in shape, size, and components are possible, depending on the characteristics desired to be imparted upon the loudspeaker 1**.

Figure 3:
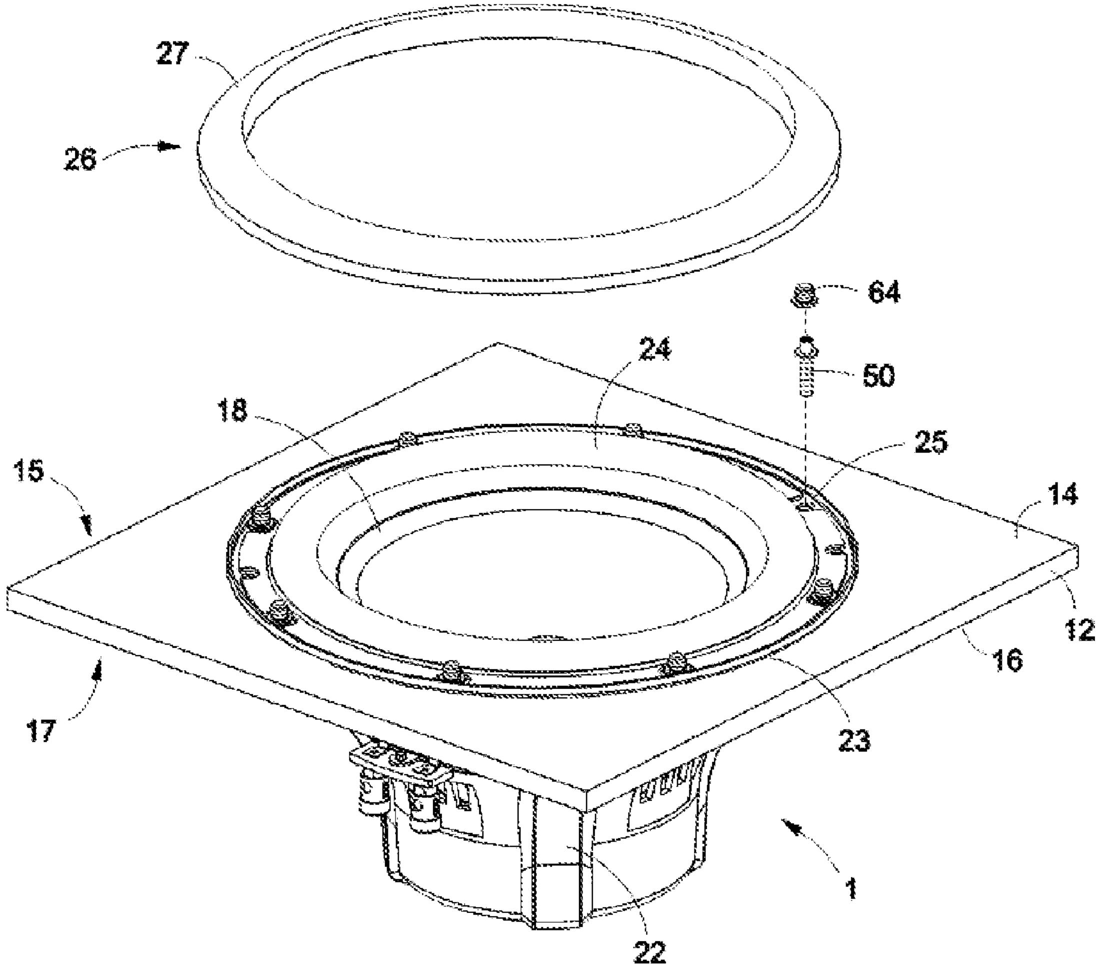
FIG. 3 is a partial exploded perspective view of the loudspeaker according to a first embodiment of the invention, the loudspeaker in a forward mounting configuration.

The mounting configuration illustrated in FIG. 1 will be referred to as a forward mounting of the loudspeaker 1 on the baffle 12, further details of which will be discussed with reference to FIGS. 3 and 4. The baffle 12 defines a baffle hole 13, through which the back section 32 may be inserted. The diameter of the baffle hole 13 is sufficiently large to accommodate the back section 32. Certain features making up the front face 30 of the loudspeaker are positioned in the top region 15, including the rim 23 and the grill 26. Further, the back section 32 is positioned in the bottom region 17. Similar to the baffle 12, the surround 24 and the cone 18 is the boundary between the top region 15 and the bottom region 17, and so have not been characterized as being positioned in either such region.

The mounting configuration illustrated in FIG. 2 will be referred to as a reverse mounting of the loudspeaker 1 on the baffle 12. Further details of the reverse mounting configuration will be discussed with reference to FIGS. 6 and 7. As was the case for the forward mounting configuration, the baffle 12 defines the baffle hole 13. In the reverse mounting configuration, however, the baffle hole 13 has a sufficient diameter capable of accommodating the surround 24 within. The rim 23 is mounted to the baffle top surface 14, thus positioning the rim 23, the grill 26, and the back section 32 in the top region 15. It is understood that while particular reference has been made to a grill 26 of the first embodiment, the aforementioned mounting thereof on the rim 23 will be equally applicable to the second and third embodiments.

Figure 5:
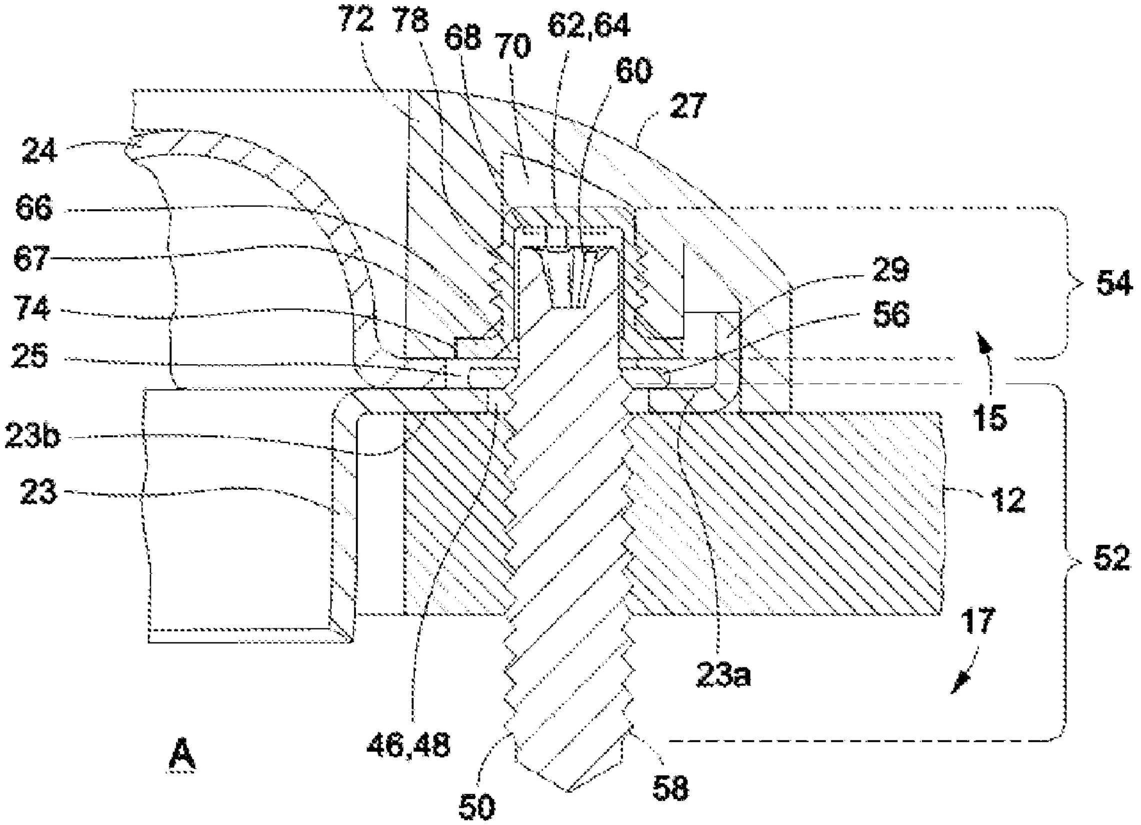
FIG. 5 is an enlarged cross-sectional view of the bounded area A of FIG. 4.

Having discussed the forward mounting configuration and the reverse mounting configuration with respect to the loudspeaker 1 and the baffle 12, further details relating to the specifics of the grill 26 and its mounting mechanisms according to several embodiments will now be considered. With reference to FIGS. 3, 4 and 5, the loudspeaker 1 is in the forward mounting configuration. In accordance with the present invention, the loudspeaker 1 includes the basket 22 having the rim 23, a speaker mounting hole 46, and a coupling hole 48 disposed through the rim 23. Further, the grill 26 defines a solid surface portion 27 that completely covers the speaker mounting hole 46 and the coupling hole 48. With specific reference to FIG. 3, when the grill 26 is attached to the rim 23 and viewed from the top, it will be appreciated that the solid surface portion 27 hides the rim 23. It is understood that according to the first embodiment as shown in FIG. 5, the speaker hole 46 and the coupling hole 48 are equivalent structures. As shown in FIG. 3, are numerous such structures distributed throughout the rim 23. The grill 26 is removably attached to the rim 23 via a first grill coupling.

The first grill coupling in accordance with the first embodiment is a fastener 50. The fastener 50 is defined by a lower body section 52 and an upper head section 54, with an inner collar 56 dividing the fastener into the respective sections. The inner collar 56 is in an abutting relationship with the rim 23. More particularly, the rim 23 includes a top rim surface **23*a* adjacent to the inner collar 56, and an opposed bottom rim surface 23*b* adjacent to the baffle top surface 16. Further, portions of the surround 24 may include a notch 25 which provides clearance for the fastener 50 to be inserted through the coupling hole 48. The lower body section 52 may also include threading 58 to facilitate a locking relationship with the baffle 12, and the upper head section 54 includes a driver head 60** for receiving a screwdriver. It will be appreciated that any particular driver head may be utilized, including, but not limited to, Phillips type, flathead type, and hex type.

The first grill coupling is engaged to a second grill coupling. According to the first embodiment, the second grill coupling is a cap 62. Thus, as illustrated in FIG. 5, the fastener 50 is engaged to the cap 62. In further detail, the cap 62 defines a closed end 64, an open end 66, a flange 67, and an interior chamber 68. The upper head section 54 is inserted into the interior chamber 68, and so the cap 62 is interposed between the fastener 50 and the grill 26. The cap 62 is inserted into a hollow bore 70 defined by an attachment member 72 disposed on the grill 26. In this regard, the attachment member 72 may be integrally formed with the grill 26, or separately constructed and thereafter be attached. Generally, the hollow bore 70 is configured to receive the second grill coupling. The attachment member 72 includes a recessed portion 74 to mate with the flange 67. In order to improve the frictional retention of the cap 62 within the attachment member 72, there is provided a plurality of protuberances 76. Referring back to FIGS. 3, 4, and 5, when attached to the rim 23, the grill 26, and in particular the solid surface portion 27, conceals from view all of the fasteners 50 and the caps 62 attached thereon. In other words, when viewed from angle F, none of the fasteners 50 are visible.

Figure 6:
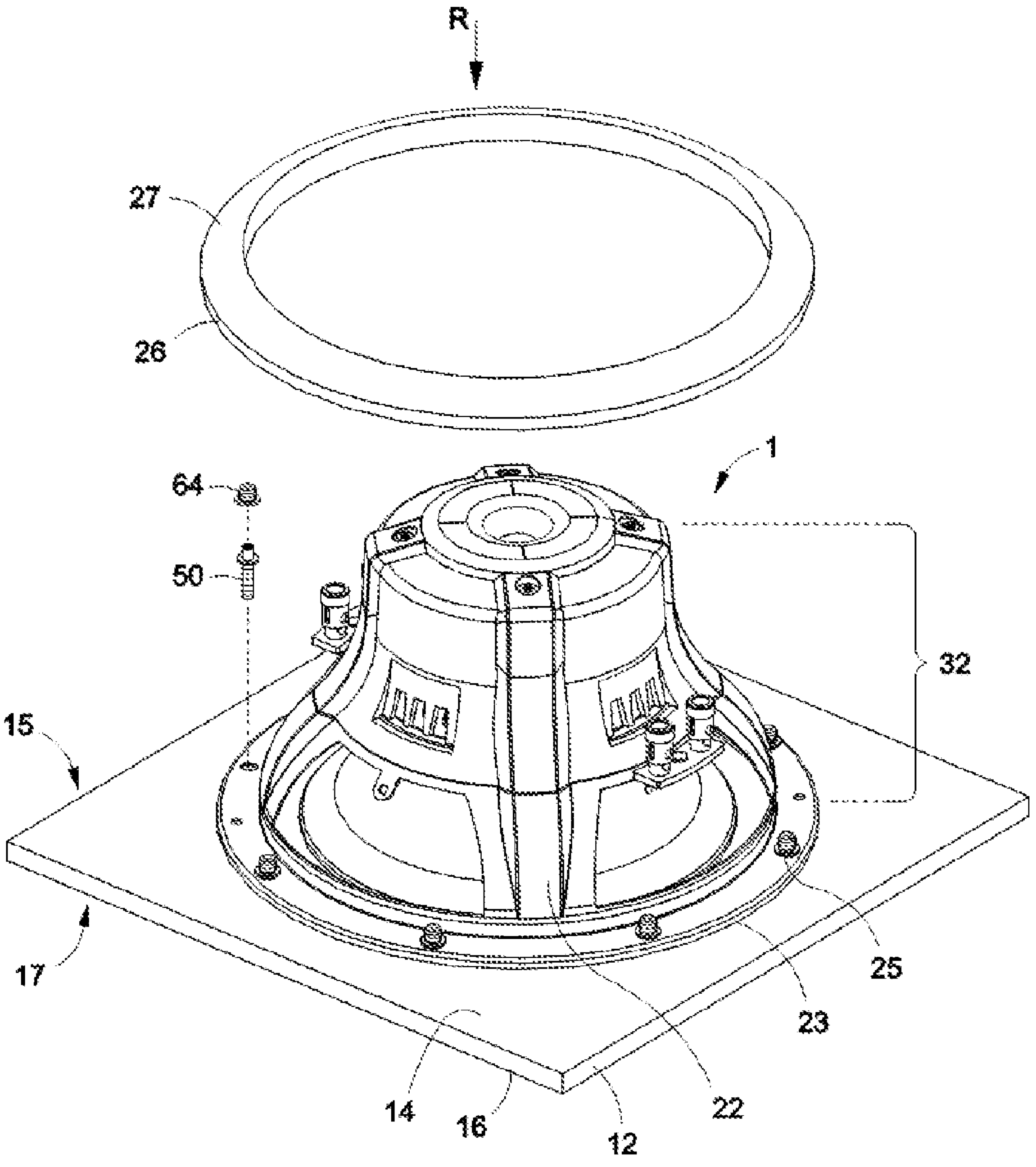
FIG. 6 is a partially exploded perspective view of the loudspeaker according to the first embodiment, the loudspeaker being in a reverse mounting configuration.
Figure 7:
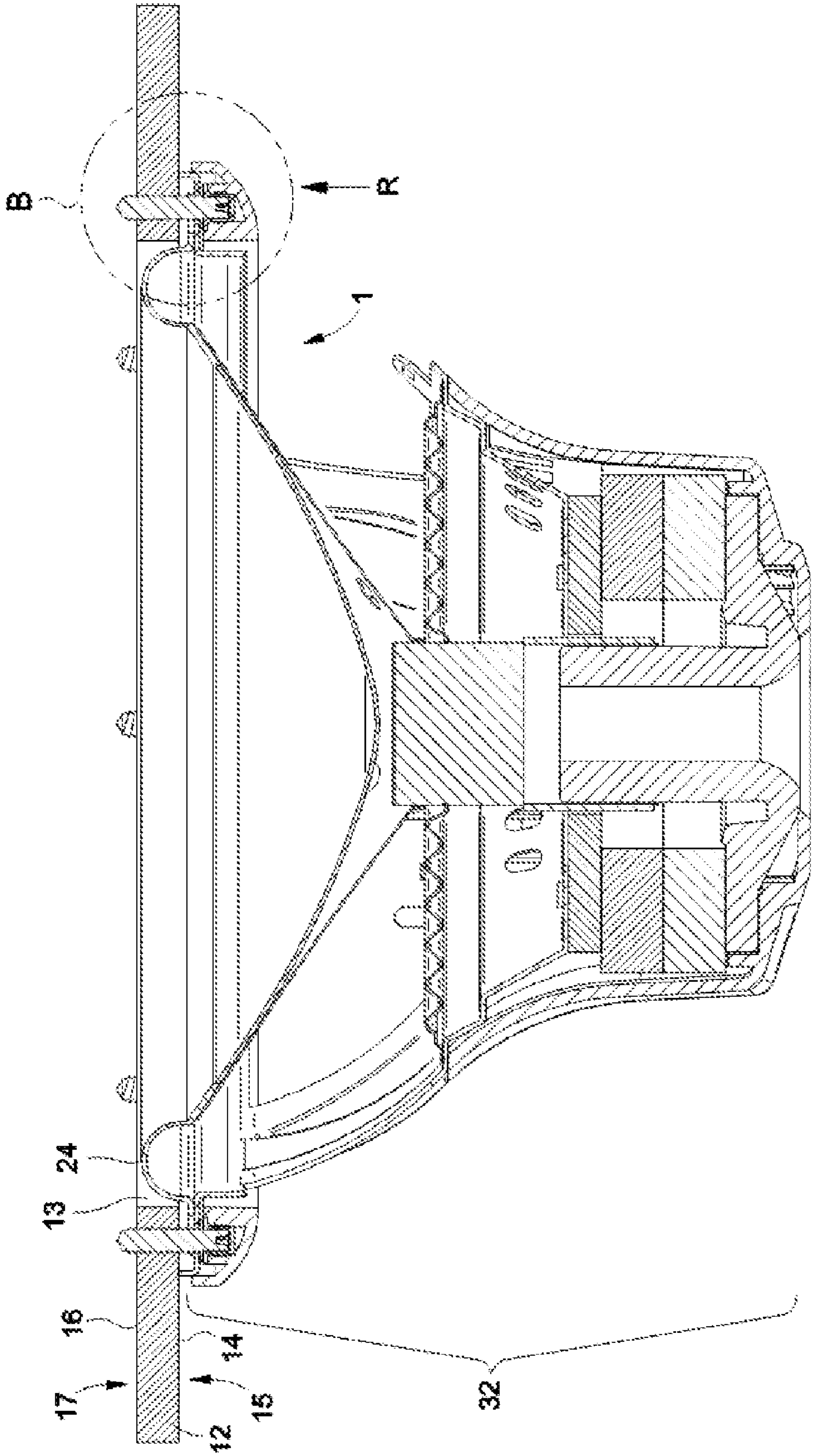
FIG. 7 is a cross-sectional view of the loudspeaker according to the first embodiment in a reverse mounting configuration.
Figure 8:
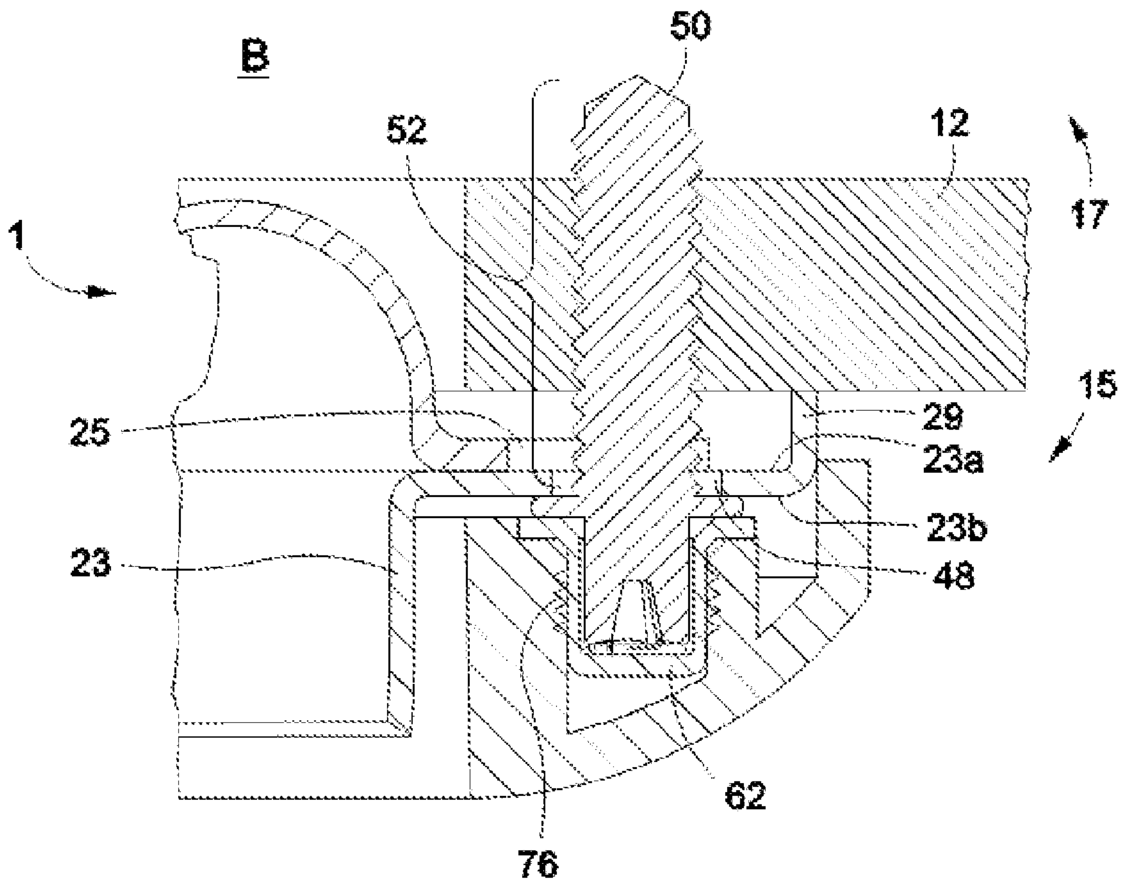
FIG. 8 is an enlarged cross-sectional view of the bounded area B of FIG. 7.

Referring to FIGS. 6, 7, and 8, there is illustrated the first embodiment of the loudspeaker 1 in the reverse mounting configuration. It is understood that all of the features described above in relation to the forward mounting configuration of the first embodiment are also present in the reverse mounting configuration, but with the arrangement of the features being modified. As considered above, the loudspeaker 1 is attached to the baffle 12 such that the rim 23, and in particular, the top rim surface 23*a*, faces the baffle top surface 14. As illustrated in FIG. 8, the rim 23 includes a raised lip portion 29 which slightly elevates the baffle 12 away from the rim 23. The fastener 50 is inserted through the coupling hole 48, and the inner collar 56 is in an abutting relationship with the bottom rim surface 23*b*. The lower body section 52 is driven into the baffle 12 from the baffle top surface 14 to the baffle bottom surface 16. The interior portion 68 of the cap 62 engages the upper head portion 54 of the fastener 50, and the outer portion of the cap 62 is engaged to the hollow bore 70 defined by the grill 26.

As indicated above, the loudspeaker 1 may be attached to the baffle 12 in either the forward mounting configuration or the reverse mounting configuration. The grill 26 may be attached to the rim 23 so as to cover, in the aforementioned manner, the speaker mounting holes 46 and the coupling holes 48 in either configuration. With particular regard to the reverse mounting configuration and the configuration of the grill 26, when attached to the rim 23 and viewed from angle R as in FIG. 6 and FIG. 7, the grill 26 covers and hides from view the fasteners 50 and the caps 62, and accordingly, the speaker mounting holes 46 and the coupling holes 48 distributed around the rim 23. In this regard, as particularly illustrated in FIGS. 3 and 6, the grill 26 defines a solid surface portion 27 which completely covers the aforementioned speaker mounting holes 46 and the coupling holes 48. It will be appreciated by one of ordinary skill in the art that such a configuration permits greater flexibility in the design elements that may be incorporated into the grill 26, since the solid surface portion 27 is unimpeded by protruding fastening elements and structures related to the accommodation of the same. Along theses lines, it is expressly contemplated that the grill 26, and in particular, the solid surface portion 27, may be shaped in various ways, and need not be limited to the particular annular configuration shown. As indicated above, in the first embodiment, the fastener 50 is operative to mount the loudspeaker 1 to the baffle 12, and in conjunction with the cap 62, to provide a mechanism for mounting the grill 26 to the loudspeaker 1.

It is understood that the grill 26 may be constructed of plastic or other like material having sufficient flexibility to grip the cap 62 via the attachment member 72. It is contemplated that the cap 62 is constructed of rubber so that it may easily slide over the upper head section 54 of the fastener 50. In order to be screwed into the baffle 12, it will be appreciated that the fastener 50 is constructed of metal or other sufficiently rigid material. Generally, one of ordinary skill in the art will appreciate the existence of a wide range of materials and variations thereof for the fabrication of the aforementioned components, and one material may be readily substituted with another without departing from the scope of the present invention.

Figure 9:
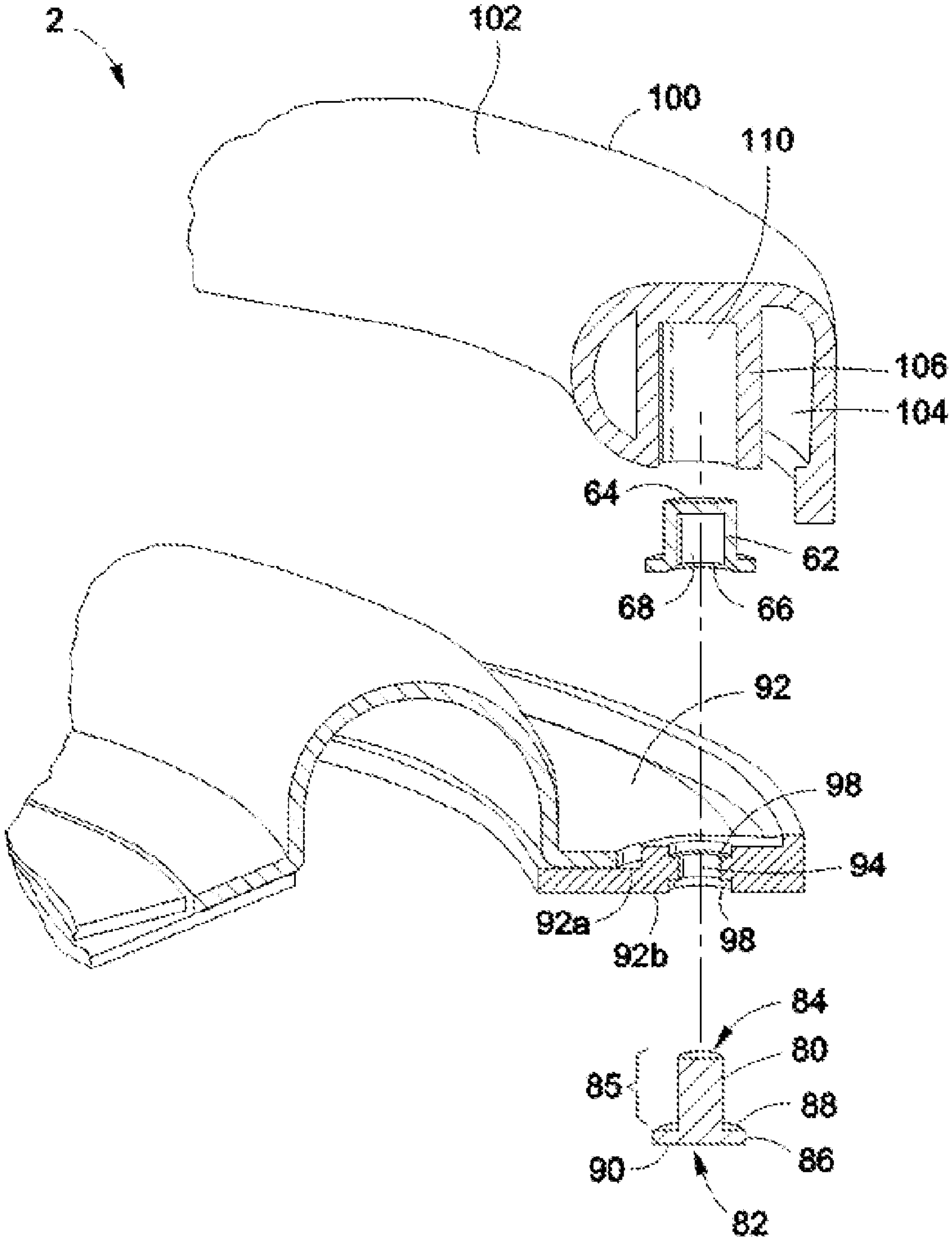
FIG. 9 is an exploded perspective view of the loudspeaker according to a second embodiment.

Having considered the first embodiment in which the speaker mounting hole 46 and the coupling hole 48 are referred to as equivalent structures and the first grill coupling is a unitary structure operative to mate the grill 26 to the basket 22 and the basket 22 to the baffle 12, second and third embodiments will now be discussed. With reference to FIG. 9, a second embodiment of a loudspeaker 2 is illustrated. The first grill coupling is a pin 80 defining a proximal end 82 and an opposed distal end 84. The pin 80 is generally defined by a cylindrical body 85. At the proximal end 82 is an integral flange 86 defining a distal flange surface 88 perpendicular to the cylindrical body 85, and a proximal flange surface 90 also defining the proximal end 82 of the pin 80.

Figure 10:
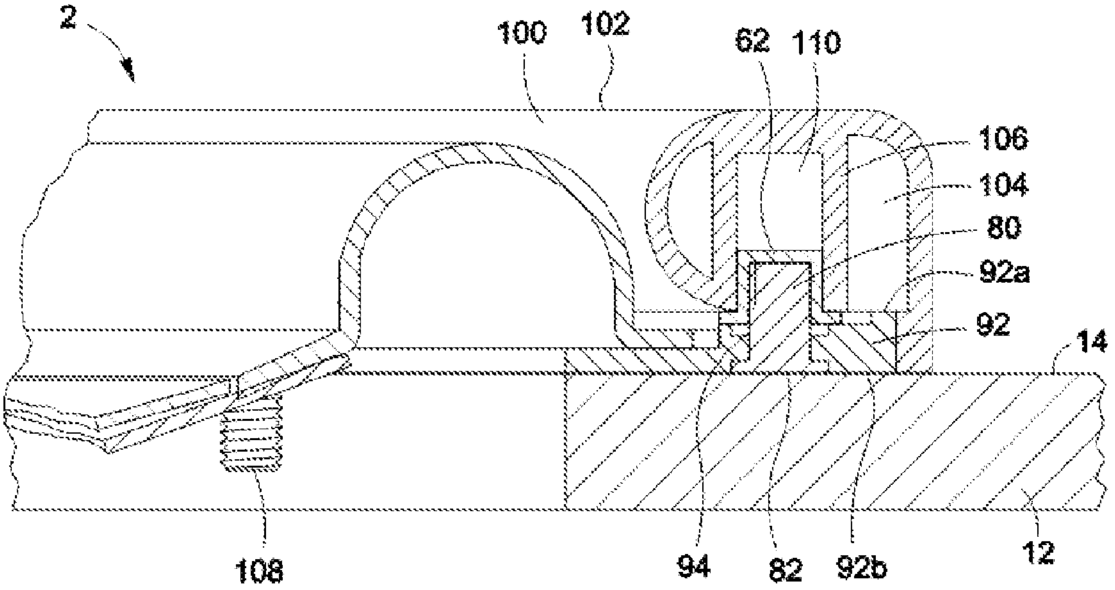
FIG. 10 is a cross-sectional view of the loudspeaker according to the second embodiment in the forward mounting configuration.
Figure 11:
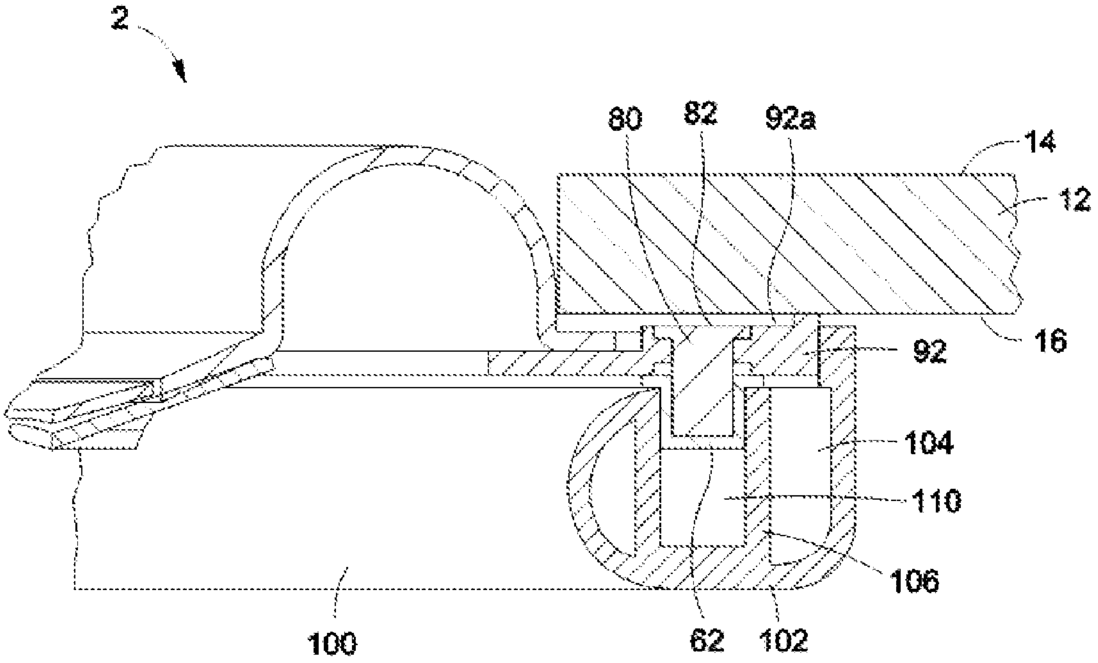
FIG. 11 is a cross-sectional view of the loudspeaker according to the second embodiment, with the loudspeaker in the reverse mounting configuration.

According to the second embodiment, there is also provided an alternative basket configuration, including a rim 92 having a coupling hole 94. The rim 92 defines a top rim surface 92*a*, and a bottom rim surface 92*b*. Extending through the rim 92 from the top rim surface 92*a* to the bottom rim surface 92*b* is the coupling hole 94. Portions of the rim 92 are recessed, defining a countersink 98. The body portion 85 is inserted through the coupling hole 94, and the flange 86 is received within the countersink 94. Thus, the proximal flange surface 98 is coplanar with the bottom rim surface 92*b*. It is understood that the bottom rim surface 92*a* and the top rim surface 92*b* both include the respective countersink 98. As illustrated in FIGS. 10 and 11, this configuration permits the same fitting of the pin 80 within the coupling hole 94 regardless of the loudspeaker 2 being in the forward mounting configuration or the reverse mounting configuration.

With regard to the second grill coupling, FIG. 9 illustrates the cap 62 defining the closed end 64, the open end 66, and the hollow chamber 68. The body portion 85 is sized and configured to be frictionally retained within the hollow chamber 68. The cap 62 is fixed to a grill 100 having an alternative configuration which defines a solid surface portion 102, an interior portion 104 that is the reverse of the solid surface portion 102, and an attachment member 106 defining a hollow interior 110. The hollow interior 110 may be cylindrical to accommodate the cylindrical shape of the cap 62.

Referring to FIG. 10, the loudspeaker 2 of the second embodiment is mounted to the baffle 12 in the forward mounting configuration. The rim 92 is disposed on the baffle top surface 14, and the pin 80 is inserted through the coupling hole 94 and secured with the cap 62. The proximal end 82 of the pin 80 is co-planar with the bottom rim surface 92*b*. The grill 100 is then engaged to the cap 62. In order to mount the loudspeaker 2 to the baffle 12, there is provided a speaker mounting hole (not shown) in a different section of the rim 92. In this regard, according to the second embodiment, the speaker mounting hole and the coupling hole 94 are separate and distinct structures arranged in any desirable configuration about the rim 92, such as in an alternating relationship or the like. Accordingly, separate mechanisms are utilized in the respective holes. A screw 108 is inserted through the speaker mounting hole, and driven into the baffle 12 to mount the loudspeaker 2 thereto, while the previously described pin 80, cap 62, and attachment member 106 cooperate to couple the grill 100 to the rim 92.

It will be understood that the loudspeaker 2 of the second embodiment may be mounted to the baffle 12 in the reverse mounting configuration. The rim 92 is positioned to face the baffle bottom surface 16, and the loudspeaker 2 is attached to the baffle 14 in a similar fashion as described above in relation to the forward mounting configuration. In further detail, the proximal end 82 is coplanar with the top rim surface 92*a*. The pin 80 is again disposed inside the cap 62, which is in turn mated to the attachment member 106 of the grill 100.

As discussed in relation to the grill 26, the grill 100 will also cover the rim 92 in the same manner as discussed above. Further, the grill may be constructed of plastic or other suitable material capable of gripping the cap 62 with the corresponding attachment member 106. With respect to the cap 62, it is understood to be constructed of rubber to readily slide over and engage the pin 80, which may also be constructed of rubber. However, selection of more rigid materials such as plastic or metal is not precluded. Generally, any suitable material for any of the aforementioned mounting mechanisms may be utilized. Relevant to the selection criteria, however, will be vibration absorbing characteristics of the material. With respect to the grill 100, it is understood that the solid surface portion 102 increases the surface area in which decorative elements may be incorporated, and is unimpeded by protruding fastening elements and structures. Further, as illustrated in FIG. 5 and FIG. 9, the external shape of the grill 26 of the first embodiment is different from the external shape of the grill 100 of the second embodiment, particularly as it relates to the sides of the solid surface portion 27 and 102, respectively. It will be readily understood by one of ordinary skill in the art that such particular shapes are presented by way of example only and not of limitation.

Figure 12:
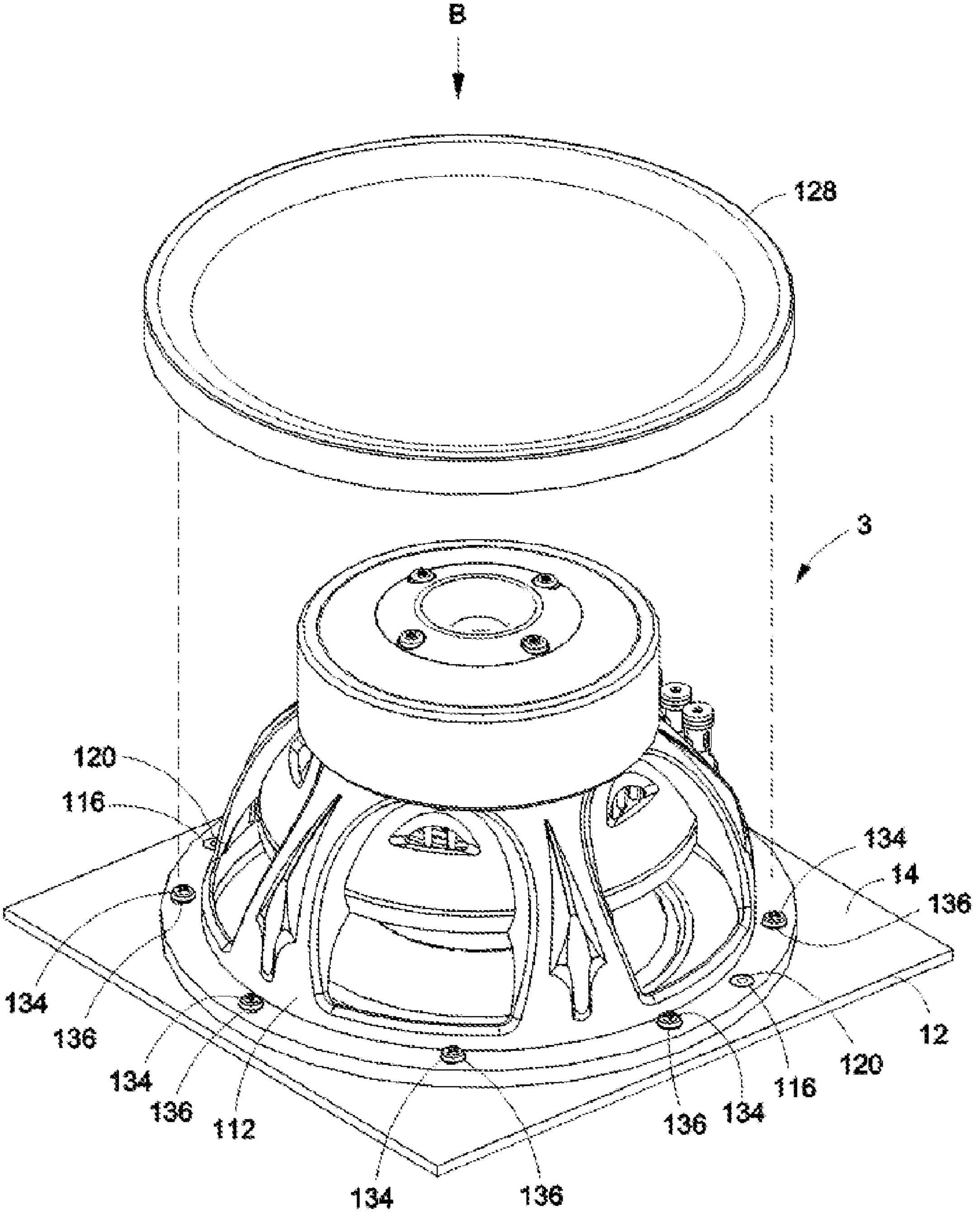
FIG. 12 is a partial exploded view of the loudspeaker according to a third embodiment, the loudspeaker being mounted to the baffle in the second configuration.
Figure 13:
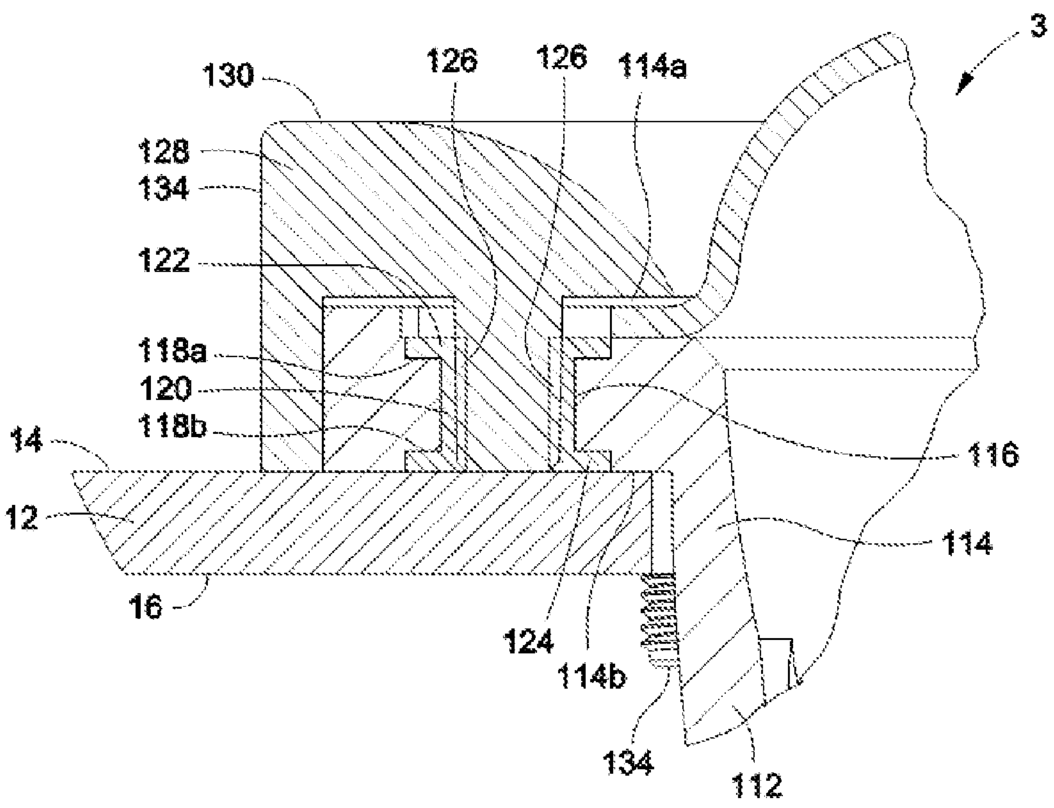
FIG. 13 is a cross-sectional view of the loudspeaker according to the third embodiment, the loudspeaker being mounted to the baffle in the first configuration.

With reference to FIGS. 12 and 13, a third embodiment of the present invention is illustrated. A loudspeaker 3 includes a basket 112 having a rim 114 defined by a top rim surface 114*a* and a bottom rim surface 114*b*. The rim 114 also defines a coupling hole 116 extending from the top rim surface 114*a* to the bottom rim surface 114*b*, with each of the surfaces having recessed portions, or offsets 118*a* and 118*b* about the coupling hole 116.

The first grill coupling is a grommet 120 having a flanged upper end 122 and a flanged lower end 124. The flanges are mated to the offsets 118*a*, 118*b*, such that the grommet 120 is flush with the top and bottom rim surfaces 114*a*, 114*b*. The grommet further defines an interior eyelet 126. By way of example only and not of limitation, the grommet 120 is shaped to match the coupling hole 116. In this regard, the coupling hole 116 is typically cylindrical, and so the grommet 120 is likewise cylindrical.

Similar to the first and second embodiments, the third embodiment of the loudspeaker 3 may likewise be attached to the baffle 12 in the forward mounting configuration as well as the reverse mounting configuration. Illustrated in FIG. 12 is the reverse mounting configuration, in which the rim 114 is attached to the baffle top surface 14 via screws 134 driven therethrough. FIG. 13 is a cross sectional view of the loudspeaker 3 mounted in the forward mounting configuration. The bottom rim surface 114 is in an abutting relationship with the baffle top surface 14, and the screw 134 is inserted through speaker mounting holes 136. With regard to the arrangement of the speaker mounting holes 136 and the coupling holes 116, it will be understood by one of ordinary skill in the art that the particular arrangement illustrated in FIG. 12 is provided by way of example only and not of limitation. Any suitable arrangement may be readily substituted without departing from the scope of the present invention.

In the third embodiment, a grill 128 having an alternative structure is provided. More particularly, the grill 128 defines solid surface portion 130, a finger 132 having material continuity with the grill 128. In other words, the finger 132 is integrally formed with the grill 128. The finger 132 may be constructed of rubber or any other suitable material, but due to its integral construction with the grill 128, the material selected should generally be suitable for both components. The finger 132 is generally opposed to the solid surface portion 130, and is engaged to the eyelet 126 of the grommet 120, attaching the grill 128 to the rim 114 of the basket 112. In order to minimize misalignment problems during insertion, the finger 132 may be tapered.

The grill 128 may also define a side wall portion 134 which may extend towards the baffle 12 to which the rim 114 is attached, and be flush with the baffle 12. Though as discussed in relation to the first and second embodiments of the loudspeaker 1 and 2, respectively, the grill may be shaped in any desirable fashion. It is understood, however, that like the grills 26, 100 of the first and second embodiments, respectively, the grill 128 is sized and configured to cover all of the coupling holes 116 and the speaker mounting holes 136. In other words, with reference to FIG. 12, when viewed from angle B, the grill 128 will conceal each of the grommets 120 distributed along the rim 114.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

What is claimed is:

1. A loudspeaker mountable on a baffle defined by a top surface and an opposed bottom surface, the loudspeaker being mountable in a forward mount configuration in which its primary radiation direction coincides with a forward direction from the baffle bottom surface to the baffle top surface and in a reverse mount configuration in which its primary radiation direction coincides with a reverse direction from the baffle top surface to the baffle bottom surface, the loudspeaker comprising:

a speaker basket including a basket rim with a front face abutting against the baffle top surface in the reverse mount configuration and an opposed rear face abutting against the baffle top surface in a forward mount configuration, the speaker basket defining a speaker mounting hole and a coupling hole through the basket rim;

a first grill coupling extending through the coupling hole to fix the basket rim to the baffle; and a grill removably attachable to the front face of the basket rim and the baffle top surface with the loudspeaker in the forward mount configuration and to the rear face of the basket rim and the baffle top surface with the loudspeaker in the reverse mount configuration, the grill being engaged to the first grill coupling, the grill defining an integral and continuous solid surface portion completely covering the speaker mounting hole and the coupling hole, the first grill coupling being interposed between the basket rim and the grill without extending therethrough and being inaccessible from the solid surface portion.

2. The loudspeaker of claim 1, wherein the speaker mounting hole and the coupling hole are aligned with respect to each other.

3. The loudspeaker of claim 1, wherein the speaker mounting hole and the coupling hole are staggered with respect to each other.

4. The loudspeaker of claim 1, further comprising a second grill coupling engaged to the first grill coupling.

5. The loudspeaker of claim 4, wherein the grill defines an attachment member having a hollow bore configured to receive the second grill coupling.

6. The loudspeaker of claim 5, wherein the hollow bore of the attachment member includes protuberances to frictionally engage the second grill coupling.

7. The loudspeaker of claim 5, wherein the second grill coupling is a cap defining a closed end, an open end, and an interior chamber, the cap being interposed between the first grill coupling and the grill.

8. The loudspeaker of claim 5, wherein the first grill coupling is a fastener having an inner collar interposed between an upper head section and a lower body section, the inner collar being in an abutting relationship with the basket rim, the upper head section being engaged to the second grill coupling, and the lower body section being inserted through the coupling hole.

9. The loudspeaker of claim 8, wherein the lower body section is driven into a baffle to securely attach the loudspeaker basket thereto.

10. The loudspeaker of claim 4, wherein the first grill coupling is a pin defining a flanged proximal end and a distal end, the flanged proximal end being engaged to a first surface of the basket rim, and the second grill coupling engaged to the distal end and in an abutting relationship with a second surface of the basket rim opposed to the first surface.

11. The loudspeaker of claim 10, wherein the first rim surface and the second rim surface of the basket rim each define a countersink concentric with the coupling hole to engage the flanged proximal end.

12. The loudspeaker of claim 10, further comprising a screw including a head and a shaft, the head being in an abutting relationship with the second rim surface, the shaft protruding from the first rim surface and driven into a baffle to securely attach the basket thereto.

13. The loudspeaker of claim 1, wherein the first grill coupling is a grommet having a flanged upper end and a flanged lower end, the grommet defining an interior eyelet and being disposed within the coupling hole.

14. The loudspeaker of claim 13, further comprising a screw driven through the basket rim into a baffle to securely attach the basket thereto.

15. The loudspeaker of claim 13, further comprising a finger having material continuity with the grill, the finger being engaged to the interior eyelet.

16. The loudspeaker of claim 15, wherein the finger is tapered.

* * * * *